United States Patent
Iwase et al.

(10) Patent No.: US 8,786,003 B2
(45) Date of Patent: Jul. 22, 2014

(54) NONVOLATILE SEMICONDUCTOR MEMORY DEVICE AND METHOD FOR MANUFACTURING SAME

(75) Inventors: Masao Iwase, Mie-ken (JP); Hiroyasu Tanaka, Mie-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 180 days.

(21) Appl. No.: 13/420,722

(22) Filed: Mar. 15, 2012

(65) Prior Publication Data
US 2013/0056816 A1 Mar. 7, 2013

(30) Foreign Application Priority Data
Sep. 1, 2011 (JP) .................................. 2011-190943

(51) Int. Cl.
*H01L 29/788* (2006.01)
*H01L 21/8247* (2006.01)

(52) U.S. Cl.
USPC ................. 257/316; 257/E29.3; 257/E21.683; 438/266

(58) Field of Classification Search
CPC .................. H01L 27/11526; H01L 27/11521; H01L 27/11531; H01L 27/11551; H01L 29/42324; H01L 29/66825; H01L 21/8239
USPC ................. 257/316, E29.3, E21.683; 438/266
See application file for complete search history.

(56) References Cited

U.S. PATENT DOCUMENTS

| | | | |
|---|---|---|---|
| 7,910,973 B2 | 3/2011 | Sakaguchi et al. | |
| 2008/0173928 A1* | 7/2008 | Arai et al. | 257/316 |
| 2009/0168482 A1* | 7/2009 | Park et al. | 365/51 |
| 2009/0242967 A1* | 10/2009 | Katsumata et al. | 257/324 |
| 2009/0278189 A1* | 11/2009 | Cho et al. | 257/316 |
| 2010/0020608 A1* | 1/2010 | Kamigaichi et al. | 365/185.05 |
| 2010/0090286 A1* | 4/2010 | Lee et al. | 257/368 |
| 2010/0096682 A1* | 4/2010 | Fukuzumi et al. | 257/314 |
| 2010/0213526 A1* | 8/2010 | Wada et al. | 257/314 |
| 2011/0057251 A1* | 3/2011 | Higashi | 257/324 |

FOREIGN PATENT DOCUMENTS

| | | | |
|---|---|---|---|
| JP | 2007-266499 A | 10/2007 | |
| JP | 2009-224633 A | 10/2009 | |
| JP | 2009-239028 A | 10/2009 | |
| JP | 2010-73812 A | 4/2010 | |

OTHER PUBLICATIONS

Office Action issued Jan. 29, 2014 in Japanese Patent Application No. 2011-190943 with English language translation.

* cited by examiner

*Primary Examiner* — Steven J Fulk
(74) *Attorney, Agent, or Firm* — Oblon, Spivak, McClelland, Maier & Neustadt, L.L.P.

(57) ABSTRACT

According to one embodiment, a nonvolatile semiconductor memory device includes: a substrate; a memory unit provided on the substrate; and a non-memory unit provided on the substrate. The memory unit includes: a first stacked body including a plurality of first electrode films and a first inter-electrode insulating film, the plurality of first electrode films being stacked along a first axis perpendicular to the major surface, the first inter-electrode insulating film being provided between two of the first electrode films mutually adjacent along the first axis; a first semiconductor layer opposing side surfaces of the first electrode films; a first memory film provided between the first semiconductor layer and the first electrode films; and a first conductive film provided on the first stacked body apart from the first stacked body. The non-memory unit includes a resistance element unit of the same layer as the conductive film.

17 Claims, 10 Drawing Sheets

US 8,786,003 B2

NONVOLATILE SEMICONDUCTOR MEMORY DEVICE AND METHOD FOR MANUFACTURING SAME

CROSS-REFERENCE TO RELATED APPLICATIONS

This application is based upon and claims the benefit of priority from the prior Japanese Patent Application No. 2011-190943, filed on Sep. 1, 2011; the entire contents of which are incorporated herein by reference.

FIELD

Embodiments described herein relate generally to a nonvolatile semiconductor memory device and a method for manufacturing same.

BACKGROUND

In recent years, three-dimensionally stacked nonvolatile semiconductor memory devices have been proposed in which multiple layers of conductive films are collectively patterned to increase the storage capacity of memory. A stacked body including electrode films alternately stacked with insulating films, a silicon pillar piercing the stacked body, and a memory film between the silicon pillar and the electrode films are provided in such a nonvolatile semiconductor memory device. In this structure, a memory cell is formed at each of the intersections between the electrode films and the silicon pillar. A peripheral circuit region including various circuits for the memory cells is provided in the periphery of the region of the memory cells.

Further downsizing is desired for such a three-dimensionally stacked nonvolatile semiconductor memory device.

DETAILED DESCRIPTION

Figure 1:
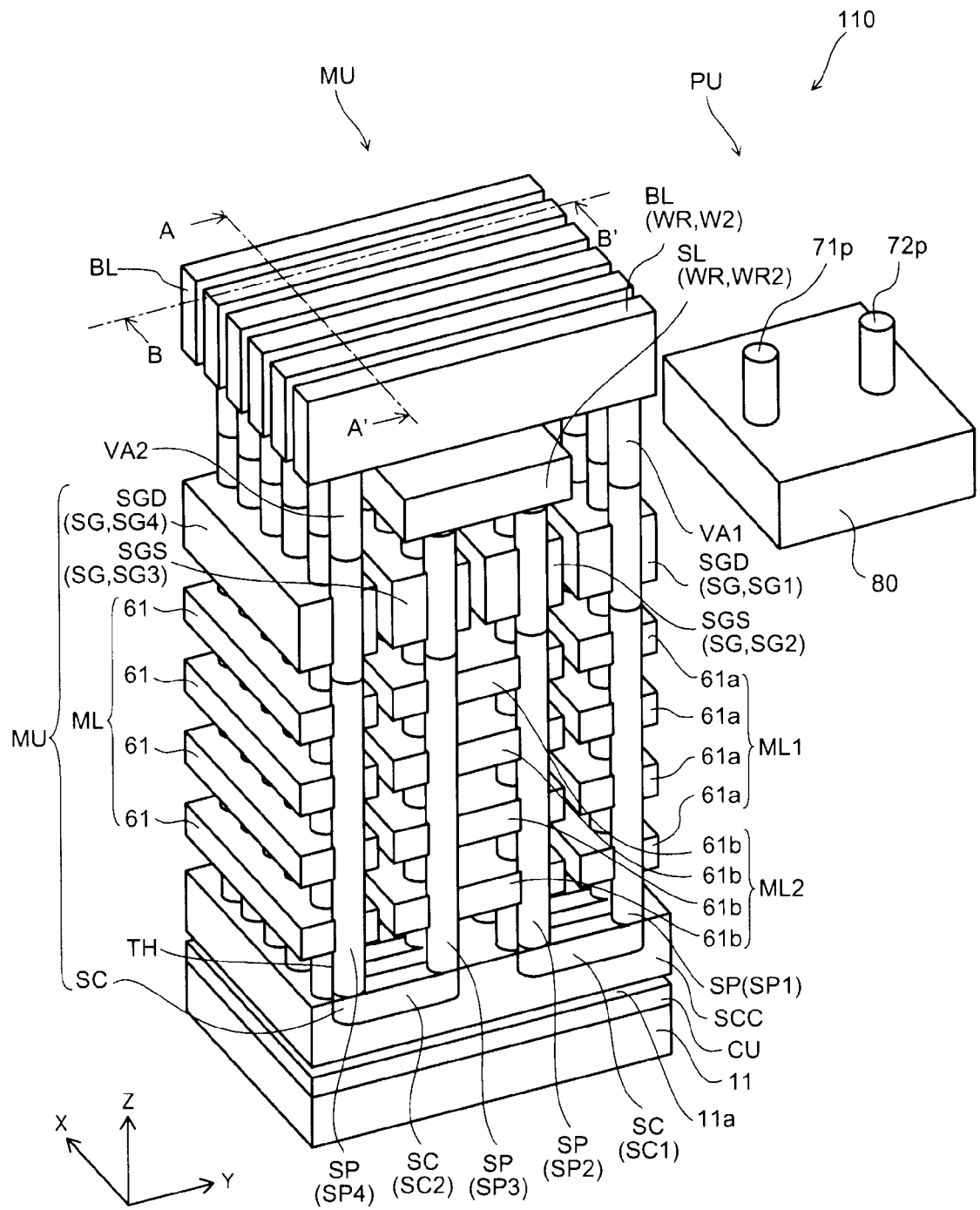
FIG. 1 is a schematic perspective view illustrating the configuration of a nonvolatile semiconductor memory device according to a first embodiment.

In general, according to one embodiment, a nonvolatile semiconductor memory device includes: a substrate; a memory unit provided on the substrate; and a non-memory unit provided on the substrate to be juxtaposed with the memory unit in a plane parallel to a major surface of the substrate. The memory unit includes: a first stacked body including a plurality of first electrode films and a first inter-electrode insulating film, the plurality of first electrode films being stacked along a first axis perpendicular to the major surface, the first inter-electrode insulating film being provided between two of the first electrode films mutually adjacent along the first axis; a first semiconductor layer opposing side surfaces of the plurality of first electrode films; a first memory film provided between the first semiconductor layer and the plurality of first electrode films; and a first conductive film provided on the first stacked body apart from the first stacked body. The non-memory unit includes a resistance element unit of the same layer as the conductive film.

In general, according to another embodiment, a method for manufacturing a nonvolatile semiconductor memory device is provided. The device includes a substrate, a memory unit provided on a major surface of the substrate, and a non-memory unit juxtaposed with the memory unit in a plane parallel to the major surface. The memory unit includes a first stacked body, a first semiconductor layer, a first memory film, and a first conductive film. The first stacked body includes a plurality of first electrode films and a first inter-electrode insulating film. The plurality of first electrode films are stacked along a first axis perpendicular to the major surface. The first inter-electrode insulating film is provided between two of the first electrode films mutually adjacent along the first axis. The first semiconductor layer is provided to oppose side surfaces of the plurality of first electrode films. The first memory film is provided between the first semiconductor layer and the plurality of first electrode films. The first conductive film is provided on the first stacked body apart from the first stacked body. The non-memory unit includes a resistance element unit of the same layer as the first conductive film.

The method includes: forming a conductive film stacked body on the major surface, the conductive film stacked body including a plurality of conductive material films stacked along the first axis and an inter-layer insulating film provided between two of the conductive material films mutually adjacent along the first axis; exposing side surfaces of the plurality of conductive material films in a first region of the conductive film stacked body used to form the memory unit; forming the first semiconductor layer in the first region to oppose the side surfaces of the plurality of conductive material films and forming the first memory film in the first region to be provided between the first semiconductor layer and the side surfaces; and forming the resistance element unit in a second region of the conductive film stacked body used to form the non-memory unit in a portion of the conductive material film of the uppermost layer of the plurality of conductive material films.

Embodiments of the invention will now be described based on the drawings.

The drawings are schematic or conceptual; and the relationships between the thicknesses and the widths of portions, the proportional coefficients of the sizes between portions, and the like are not necessarily the same as the actual values thereof. The dimensions and the proportional coefficients may be illustrated differently among the drawings, even for identical portions.

In the specification and the drawings of the application, components similar to those described in regard to a drawing thereinabove are marked with like reference numerals; and a detailed description is omitted as appropriate.

First Embodiment

FIG. 1 is a schematic perspective view illustrating the configuration of a nonvolatile semiconductor memory device according to a first embodiment.

For easier viewing of FIG. 1, only conductive portions are illustrated, and insulating portions are not illustrated.

Figure 2:
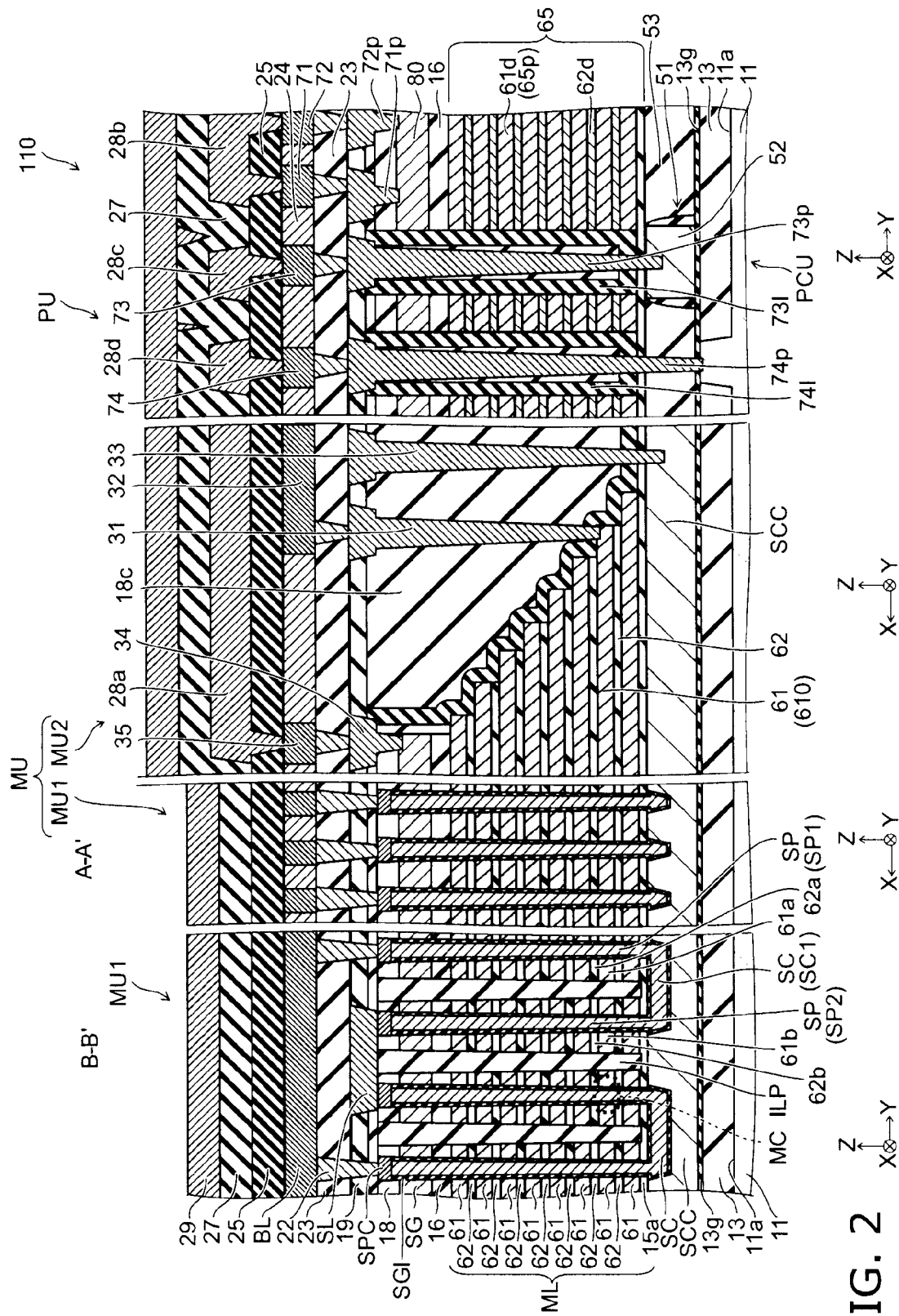
FIG. 2 is a schematic cross-sectional view illustrating the configuration of the nonvolatile semiconductor memory device according to the first embodiment.

FIG. 2 is a schematic cross-sectional view illustrating the configuration of the nonvolatile semiconductor memory device according to the first embodiment.

In FIG. 2, a portion of the cross section along line A-A' of FIG. 1 and a portion of the cross section along line B-B' of FIG. 1 are illustrated as a matrix memory cell unit MU1.

Figure 3:
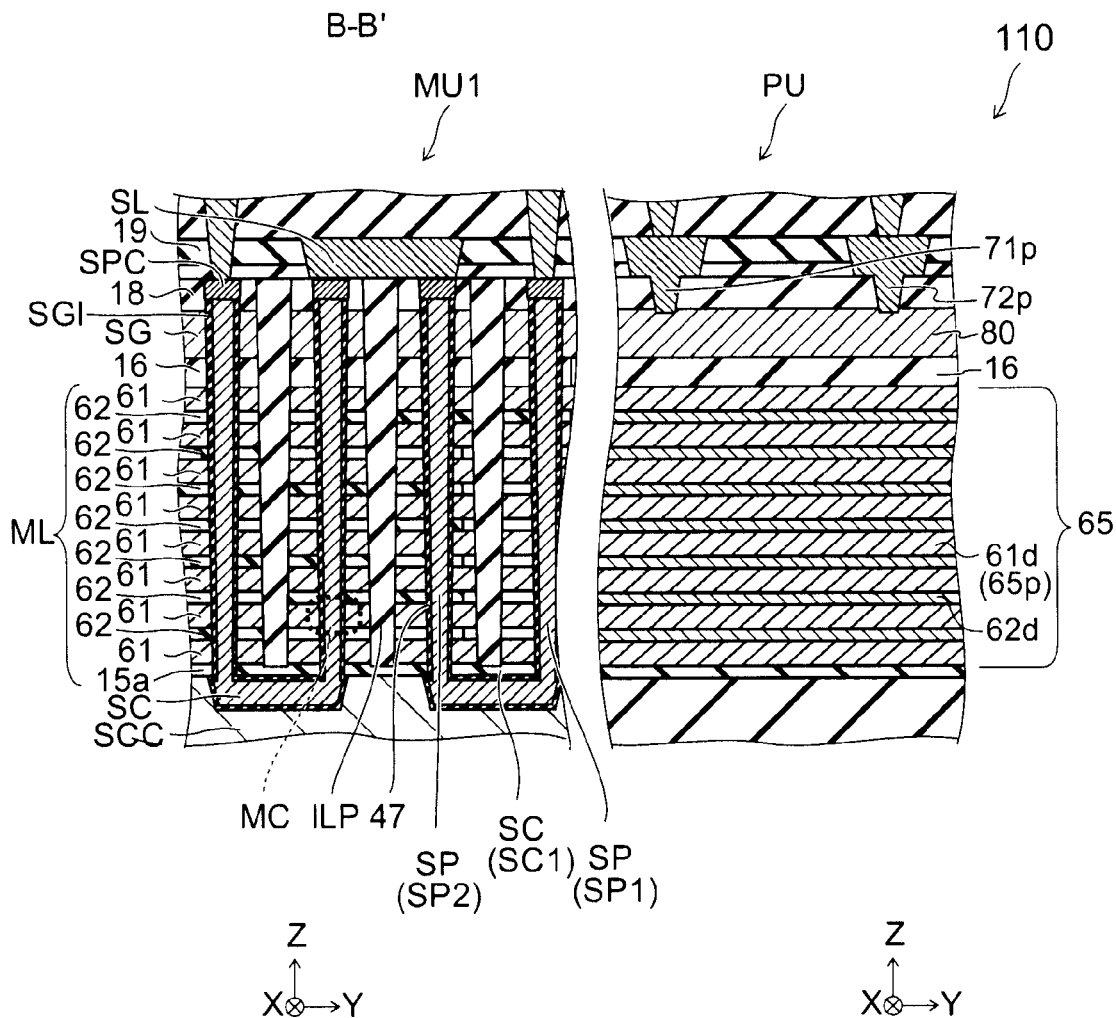
FIG. 3 is a schematic cross-sectional view illustrating the configuration of a portion of the nonvolatile semiconductor memory device according to the first embodiment.

FIG. 3 is a schematic cross-sectional view illustrating the configuration of a portion of the nonvolatile semiconductor memory device according to the first embodiment.

FIG. 3 illustrates portions of a memory unit MU and a non-memory unit PU.

As illustrated in FIG. 1 and FIG. 2, the nonvolatile semiconductor memory device 110 according to the embodiment includes a substrate 11, the memory unit MU, and the non-memory unit PU. A resistance element unit 80 is included in the non-memory unit PU.

The substrate 11 includes, for example, a silicon substrate.

The memory unit MU is provided on a major surface 11a of the substrate 11.

In the specification, an axis perpendicular to the major surface 11a of the substrate 11 is taken as a Z axis (a first axis); one of the axes (second axes) perpendicular to the Z axis is taken as an X axis; and one other of the axes (the second axes) perpendicular to the Z axis that is perpendicular to the X axis is taken as a Y axis.

The direction along the Z axis away from the major surface 11a of the substrate 11 is taken as up (the upper side); and the opposite of up is taken as down (the lower side).

The memory unit MU includes the matrix memory cell unit MU1 and an interconnect connection unit MU2. The matrix memory cell unit MU1 includes, for example, memory cell transistors arranged in a three-dimensional matrix configuration.

The interconnect connection unit MU2 is a portion configured to connect the interconnects of the matrix memory cell unit MU1.

The memory unit MU includes a stacked body ML, semiconductor pillars SP, and selection gate electrodes SG.

The stacked body ML includes multiple electrode films 61 stacked along the Z axis and an inter-electrode insulating film 62 (the first inter-electrode insulating film) provided between two electrode films 61 mutually adjacent along the Z axis. The selection gate electrode SG is provided on the stacked body ML.

In the embodiment, the semiconductor pillar SP is an example of a semiconductor layer; and the selection gate electrode SG is an example of a conductive film.

The electrode film 61 has a portion extending in a band configuration along the X-axis direction. The selection gate electrode SG also has a portion extending in a band configuration along the X-axis direction.

The semiconductor pillar SP is provided to pierce the stacked body ML and the selection gate electrode SG along the Z-axis direction. The semiconductor pillar SP is formed by, for example, filling a semiconductor into a through-hole TH that pierces the stacked body ML and the selection gate electrode SG along the Z-axis direction. The semiconductor pillar SP has a tubular configuration (e.g., a cylindrical configuration) or a columnar configuration (e.g., a circular columnar configuration) extending in the Z-axis direction. The interior of the semiconductor pillar SP may be hollow; or, for example, an insulating layer and the like may be provided inside the semiconductor pillar SP.

In the memory unit MU of the nonvolatile semiconductor memory device 110, memory cell transistors that include storage layers are formed at portions where the electrode films 61 intersect the semiconductor pillars SP. The memory cell transistors are arranged in a three-dimensional matrix configuration; and each of the memory cell transistors functions as a memory cell MC that is configured to store information (data) by storing charge in the storage layer.

The selection gate electrode SG is provided on the stacked body ML apart from the stacked body ML along the Z axis. Although the case is illustrated in this specific example where the conductive film is the selection gate electrode SG, the conductive film may be an electrode film that has functions other than those of the selection gate electrode SG.

The non-memory unit PU is provided on the substrate 11 and is juxtaposed with the memory unit MU in a plane parallel to the major surface 11a of the substrate 11. In other words, the non-memory unit PU is, for example, juxtaposed with the memory unit MU in the major surface 11a (in the X-Y plane). As an example, the non-memory unit PU is disposed to be adjacent to the memory unit MU along the Y axis in the nonvolatile semiconductor memory device 110 illustrated in FIG. 1. The non-memory unit PU may be disposed to be adjacent to the memory unit MU along the X axis or disposed around the memory unit MU along the X-Y plane. Multiple non-memory units PU may be provided for one memory unit MU. Other portions may be provided between the memory unit MU and the non-memory unit PU.

The non-memory unit PU includes the resistance element unit 80 provided in the same layer as the selection gate electrode SG.

Herein, a layer of A being the same layer as a layer of B refers to the position of the layer of A along the Z axis being the same as the position of the layer of B along the Z axis. For example, a layer having the same distance along the Z-axis direction from the major surface 11a as the layer of B is of the same layer as the layer of B.

The resistance element unit 80 is the same layer as the selection gate electrode SG and extends along the X-Y plane. The surface area and the configuration of the resistance element unit 80 as viewed from the Z-axis direction may be appropriately selected. The thickness of the resistance element unit 80 along the Z-axis direction is, for example, equal to the thickness of the selection gate electrode SG along the Z-axis direction.

Dummy conductive films 65 may be provided in the non-memory unit PU. The dummy conductive films 65 include a portion 65p of the same layer as at least one of the multiple electrode films 61 (the first electrode films 61a). For example, the distance along the Z axis from the major surface 11a to the electrode film 61 of the uppermost layer of the stacked body ML is equal to the distance along the Z axis from the major surface 11a to the portion 65p of the uppermost layer of the dummy conductive films 65.

In the case where the dummy conductive films 65 are provided in the non-memory unit PU, the resistance element unit 80 is formed on the dummy conductive films 65 in the same layer as the selection gate electrode SG. The embodiment illustrates the case where the dummy conductive films 65 are provided.

As in the embodiment, the formation of the resistance element unit 80 is easier by providing the resistance element unit 80 in the same layer as the selection gate electrode SG. For example, the resistance element unit 80 may be manufactured by the same process as the selection gate electrode SG.

The resistance element unit 80 is formed in a layer that is higher than the dummy conductive films 65. Accordingly, the design freedom of the disposition and the configuration of the resistance element unit 80 increases. It is unnecessary to dig through the dummy conductive films 65 when forming contact electrodes 71p and 72p to the resistance element unit 80. Thereby, the manufacturing of the contact electrodes 71p and 72p is easier.

An example of the configuration of the memory unit MU will now be described in detail.

In the nonvolatile semiconductor memory device 110 as illustrated in FIG. 1, FIG. 2, and FIG. 3, an inter-layer insulating film 13 is provided on the major surface 11a of the substrate 11; and an insulating film 13g is provided on the inter-layer insulating film 13. The insulating film 13g is an insulating film that functions as a gate insulating film of a peripheral circuit transistor 51 described below. A connection portion conductive layer SCC described below is provided on the insulating film 13g; and the stacked body ML is provided on the connection portion conductive layer SCC.

Although eight of the electrode films 61 are illustrated in FIG. 2 and FIG. 3, the number of the electrode films 61 provided in the stacked body ML is arbitrary.

The electrode films 61 (the first electrode films 61a and the second electrode films 61b) and the connection portion conductive layer SCC may include any conductive material. For example, amorphous silicon (amorphous silicon) provided with conductivity by introducing an impurity, polysilicon (polycrystalline silicon) provided with conductivity by introducing an impurity, and the like may be used; and a metal, an alloy, and the like may be used.

The portion of the semiconductor pillar SP that pierces the stacked body ML and the portion of the semiconductor pillar SP that pierces the selection gate electrode SG may be a continuously-formed semiconductor layer; or the portion of the semiconductor pillar SP that pierces the stacked body ML and the portion of the semiconductor pillar SP that pierces the selection gate electrode SG may be formed by separate processes, and the portions may be electrically connected.

An insulating film 15a may be provided under the electrode film 61 of the lowermost portion (e.g., the side most proximal to the substrate 11) of the stacked body ML. The insulating film 15a also may be included in the stacked body ML. An insulating film also may be provided on the electrode film 61 of the uppermost portion (e.g., the side most distal to the substrate 11) of the stacked body ML. This insulating film also may be included in the stacked body ML. Such insulating films may include, for example, silicon oxide.

The selection gate electrodes SG are provided on the stacked body ML. The selection gate electrodes SG (a first selection gate electrode SG1 and a second selection gate electrode SG2) may include any conductive material. For example, amorphous silicon (amorphous silicon) provided with conductivity by introducing an impurity, polysilicon (polycrystalline silicon) provided with conductivity by introducing an impurity, and the like may be used; and a metal, an alloy, and the like may be used.

An inter-layer insulating film 16 is provided between the stacked body ML and the selection gate electrodes SG. Inter-layer insulating films ILP are provided to divide the electrode films 61 from each other along the Y-axis direction. The inter-layer insulating films ILP extend along the X-axis direction. In this specific example, the inter-layer insulating films ILP also divide the selection gate electrodes SG in the Y-axis direction.

An inter-layer insulating film 18 is provided on the selection gate electrodes SG and the inter-layer insulating films ILP; and a source line SL (a second interconnect WR2) and contact electrodes 22 are provided on the inter-layer insulating film 18. An inter-layer insulating film 19 is provided around the source line SL. In this specific example, the source line SL has a band configuration along the X-axis direction.

An inter-layer insulating film 23 is provided on the source line SL; and a bit line BL (a first interconnect WR1) is provided on the inter-layer insulating film 23. The bit line BL has, for example, a band configuration along the Y-axis direction.

An inter-layer insulating film 25, an inter-layer insulating film 27, and a passivation film 29 are provided on the bit line BL.

The inter-layer insulating films 13, 16, 18, 19, 23, 25, and 27 may include, for example, silicon oxide. The insulating film 13g also may include, for example, silicon oxide. The passivation film 29 may include, for example, silicon nitride.

Multiple semiconductor pillars SP are provided in the nonvolatile semiconductor memory device 110. The number of the semiconductor pillars SP is arbitrary. In the specification, the multiple semiconductor pillars are called the semiconductor pillars SP when generally referring to the multiple semiconductor pillars. When referring to a designated semiconductor pillar, the semiconductor pillar is called the nth semiconductor pillar SPn (where n is any integer not less than 1). Other components also are illustrated similarly to the description recited above.

In this specific example, every two semiconductor pillars SP are connected to each other on the substrate 11 side.

In other words, the nonvolatile semiconductor memory device 110 further includes a semiconductor connection portion SC that electrically connects a first semiconductor pillar SP1 (a first semiconductor layer) to a second semiconductor pillar SP2 (a second semiconductor layer) on the substrate 11 side. The semiconductor connection portion SC connects one end of the first semiconductor pillar SP1 to one end of the second semiconductor pillar SP2. The semiconductor connection portion SC may include the material used to form the semiconductor pillars SP.

The first semiconductor pillar SP1 pierces a first stacked body ML1 and the first selection gate electrode SG1 along the Z-axis direction. The first stacked body ML1 includes the multiple first electrode films 61a stacked in the Z-axis direction. A first inter-electrode insulating film 62a is provided between two first electrode films 61a mutually adjacent in the Z-axis direction.

The second semiconductor pillar SP2 pierces a second stacked body ML2 and the second selection gate electrode SG2 along the Z-axis direction. The second stacked body ML2 is adjacent to the first stacked body ML1 along the Y axis. The second stacked body ML2 includes the multiple second electrode films 61b stacked in the Z-axis direction. A second inter-electrode insulating film 62b is provided between two second electrode films 61b mutually adjacent in the Z-axis direction.

As illustrated in FIG. 1, the first semiconductor pillar SP1 and the second semiconductor pillar SP2 are a pair connected by a first semiconductor connection portion SC1 to form one NAND string having a U-shaped configuration; and a third semiconductor pillar SP3 and a fourth semiconductor pillar SP4 are a pair connected by a second semiconductor connection portion SC2 to form one other NAND string having a U-shaped configuration.

In the interconnect connection unit MU2 as illustrated in FIG. 2, one X-axis direction end of each of the electrode films 61 is connected to a word interconnect 32 by a contact electrode 31 and is electrically connected to, for example, a drive circuit provided in the substrate 11.

In the interconnect connection unit MU2, each of the electrode films 61 extends in the X-axis direction. These extended portions are draw-out interconnects 610. The lengths of the draw-out interconnects 610 along the X-axis direction differ along the Z-axis direction between the layers of the draw-out interconnects 610. Thereby, the lengths of the draw-out interconnects 610 in the X-axis direction change in a stairstep configuration. The draw-out interconnects 610 are electrically connected to the drive circuit at one X-axis direction end.

Thereby, the potential set by the electrode films 61 that have the same distance from the substrate 11 is different between the first semiconductor pillar SP1 and the second semiconductor pillar SP2 which form a pair. Accordingly, the memory cells MC of the same layer corresponding to the first semiconductor pillar SP1 and the second semiconductor pillar SP2 are operated independently from each other. This is similar also for the third semiconductor pillar SP3 and the fourth semiconductor pillar SP4.

The connection portion conductive layer SCC is connected to an interconnect for the connection portion conductive layer by, for example, a contact electrode 33.

The selection gate electrode SG is connected to an interconnect 35 for the selection gate electrode by, for example, a contact interconnect 34. The inter-layer insulating film 25 is provided on the interconnect 35; and a metal interconnect 28a that is connected to the interconnect 35 is provided on the inter-layer insulating film 25.

The side surfaces of the contact electrodes 31 and 34 are covered with an inter-layer insulating film 18c.

As illustrated in FIG. 1, the end of each of the semiconductor pillars SP opposite to the semiconductor connection portion SC is connected to the bit line BL or the source line SL; and the desired data can be programmed to or read from any of the memory cells MC of any of the semiconductor pillars SP by the selection gate electrodes SG (the first to fourth selection gate electrodes SG1 to SG4) being provided respectively for the semiconductor pillars SP.

As illustrated in FIG. 1, the first semiconductor pillar SP1 is connected to the bit line BL by a contact electrode VA1; and the fourth semiconductor pillar SP4 is connected to the bit line BL by a contact electrode VA2. The contact electrodes VA1 and VA2 correspond to the contact electrodes 22 illustrated in FIG. 2.

Figure 4:
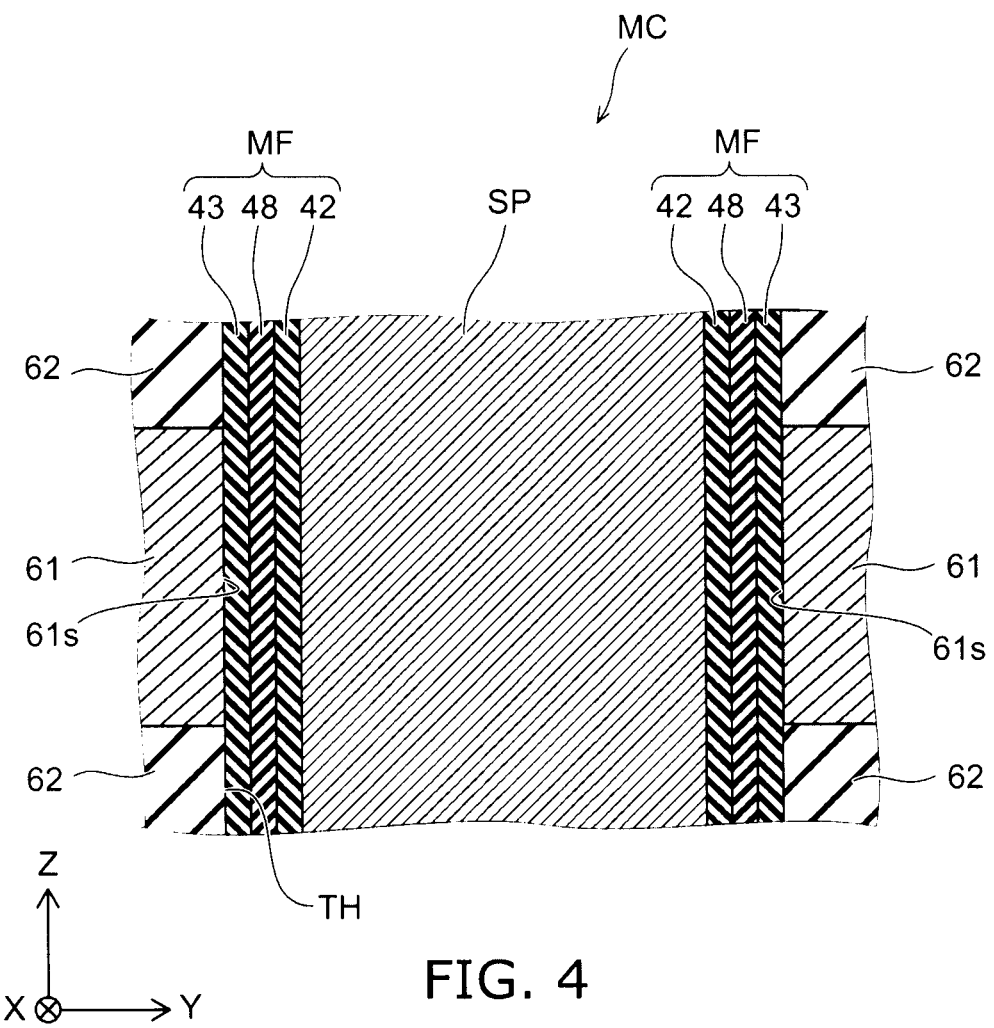
FIG. 4 is a schematic cross-sectional view illustrating the configuration of the memory cell.

FIG. 4 is a schematic cross-sectional view illustrating the configuration of the memory cell.

As illustrated in FIG. 4, the semiconductor pillar SP opposes side surfaces 61s of the electrode films 61. A memory film MF is provided between the semiconductor pillar SP and the electrode films 61. The memory film MF is provided along the Z axis around the semiconductor pillar SP. Memory cell transistors are formed at portions of the memory film MF where the electrode films 61 intersect the semiconductor pillar SP; and each of the memory cell transistors is a memory cell MC.

The memory film MF includes an outer insulating film 43 (a first insulating film), a storage layer 48 (a second insulating film), and an inner insulating film 42 (a third insulating film). The outer insulating film 43 is provided between the storage layer 48 and the electrode film 61. The inner insulating film 42 is provided between the storage layer 48 and the semiconductor pillar SP. In other words, the memory film MF includes the outer insulating film 43, the storage layer 48, and the inner insulating film 42 stacked in this order from the electrode films 61 toward the semiconductor pillar SP inside the through-hole TH.

The outer insulating film 43 and the inner insulating film 42 may include, for example, a material including an oxide (silicon oxide, etc.). The storage layer 48 may include, for example, a material including a nitride (silicon nitride, etc.). The outer insulating film 43, the storage layer 48, and the inner insulating film 42 may be single-layer films or may be stacked films. The materials are not limited to those recited above; and any material may be used.

In the memory cell MC, the storage layer 48 functions as a portion configured to store the information by a charge being stored or emitted by an electric field applied between the semiconductor pillar SP and the electrode film 61. In other words, the storage layer 48 functions as a charge storage layer.

The inner insulating film 42 functions as a tunneling insulating film in each of the memory cells MC. The outer insulating film 43 functions as a blocking insulating film in each of the memory cells MC.

An example of the configuration of the non-memory unit PU will now be described in detail.

As illustrated in FIG. 2 and FIG. 3, the non-memory unit PU includes the resistance element unit 80 provided on the dummy conductive films 65 described above, the contact electrodes 71p and 72p, and a peripheral circuit unit PCU. The peripheral circuit unit PCU includes the peripheral circuit transistor 51 provided between the substrate 11 and the dummy conductive films 65.

The inter-layer insulating film 13 is provided as an element-separating insulation layer (Shallow Trench Isolation (STI)) on the major surface 11a side of the substrate 11. The portion of the substrate 11 on the major surface 11a side is divided by the inter-layer insulating film 13. The insulating film 13g is provided on the substrate 11 divided by the STI; and a peripheral circuit gate electrode 52 is provided on the insulating film 13g. The insulating film 13g opposing the peripheral circuit gate electrode 52 is used to form the gate insulating film of the peripheral circuit transistor 51; and the peripheral circuit gate electrode 52 is used as the gate electrode of the peripheral circuit transistor 51.

The peripheral circuit gate electrode 52 is, for example, the same layer as the connection portion conductive layer SCC of the memory unit MU. The peripheral circuit gate electrode 52 may include, for example, the same material as the connection portion conductive layer SCC of the memory unit MU.

The peripheral circuit gate electrode 52 is connected to an interconnect 73 via, for example, a contact electrode 73p. A portion of the substrate 11 (the silicon substrate) that is another portion of the peripheral circuit unit PCU is connected to an interconnect 74 via a contact electrode 74p.

The contact electrodes 73p and 74p pierce the dummy conductive films 65 along the Z-axis direction. An inter-layer insulating film 731 is provided between the contact electrode 73p and the dummy conductive films 65. An inter-layer insulating film 74I is provided between the contact electrode 74p and the dummy conductive films 65.

In the non-memory unit PU as illustrated in FIG. 3, the inter-layer insulating film 16 is provided on the dummy conductive films 65; and the resistance element unit 80 is provided on the inter-layer insulating film 16. The resistance element unit 80 is provided in the same layer as the selection gate electrode SG of the memory unit MU. The resistance element unit 80 is formed on the dummy conductive films 65, that is, higher than the uppermost layer of the stacked body ML. Accordingly, it is sufficient for the depth along the Z-axis direction of the contact electrodes 71p and 72p provided on the resistance element unit 80 to be enough to pierce the inter-layer insulating film 18.

Figure 5:
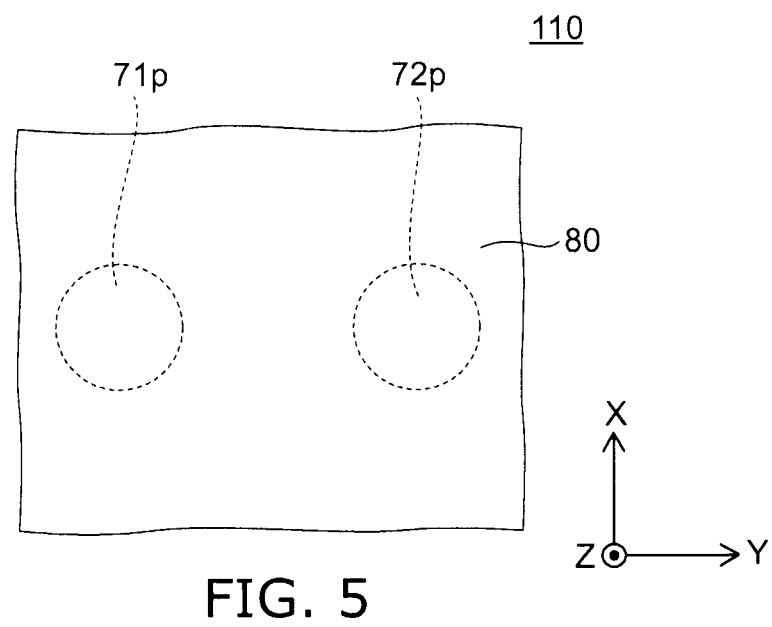
FIG. 5 is a schematic plan view of the resistance element unit.

FIG. 5 is a schematic plan view of the resistance element unit.

The resistance element unit 80 is provided in the same layer as the selection gate electrode SG and is provided with a prescribed surface area and a prescribed configuration as viewed from the Z-axis direction. The resistance value of the resistance element unit 80 is set by the impurity concentration of the material of the resistance element unit 80.

For example, in the case where the resistance element unit 80 and the selection gate electrode SG include polycrystalline silicon, the impurity concentration of the resistance element unit 80 is lower than the impurity concentration of the selection gate electrode SG. Thereby, the resistance element unit 80 can have a higher resistance value than the selection gate electrode SG and can function as a resistance element even in the case where the material of the resistance element unit 80 is the same as the material of the selection gate electrode SG.

A silicide is included in the selection gate electrode SG to reduce the resistance of the selection gate electrode SG and the like. In such a case, the silicide is not included in the resistance element unit 80. Thereby, the resistance value of the resistance element unit 80 can be higher than the resistance value of the selection gate electrode SG; and the resistance element unit 80 can function as a resistance element.

The resistance value of the resistance element unit 80 may be set by, for example, the spacing of the contact electrodes 71p and 72p along the X-Y plane.

In the embodiment as recited above, the resistance element unit 80 is disposed higher than the layer structure of the stacked body ML. Therefore, the disposition of the contact electrodes 71p and 72p and the layout of the interconnects including the contact electrodes 71p and 72p can be easy.

For example, in the case where the resistance element unit 80 is disposed on the lower side of the layer structure of the stacked body ML or lower than the stacked body ML, it is necessary to form deep contact electrodes 71p and 72p. In such a case, there are more constraints on the design of the draw-out interconnects including the contact electrodes 71p and 72p, which leads to more dedicated surface area for the layout of the interconnects. In the embodiment, the dedicated surface area for the layout of the interconnects can be smaller because the design freedom of the interconnect layout is high. Thereby, the non-memory unit PU can be smaller; and downsizing of the nonvolatile semiconductor memory device 110 can be realized.

An example of a method for manufacturing the nonvolatile semiconductor memory device 110 will now be described.

FIG. 6 to FIG. 9 are schematic cross-sectional views illustrating the method for manufacturing the nonvolatile semiconductor memory device.

In these drawings, the region used to form the memory unit MU is taken as a memory region MUR (a first region); and the region used to form the non-memory unit PU is taken as a non-memory region PUR (a second region). The region of the substrate 11 where the matrix memory cell unit MU1 is provided is taken as a matrix memory cell region MU1R; and the region of the substrate 11 where the interconnect connection unit MU2 is provided is taken as an interconnect connection region MU2R.

Figure 6:
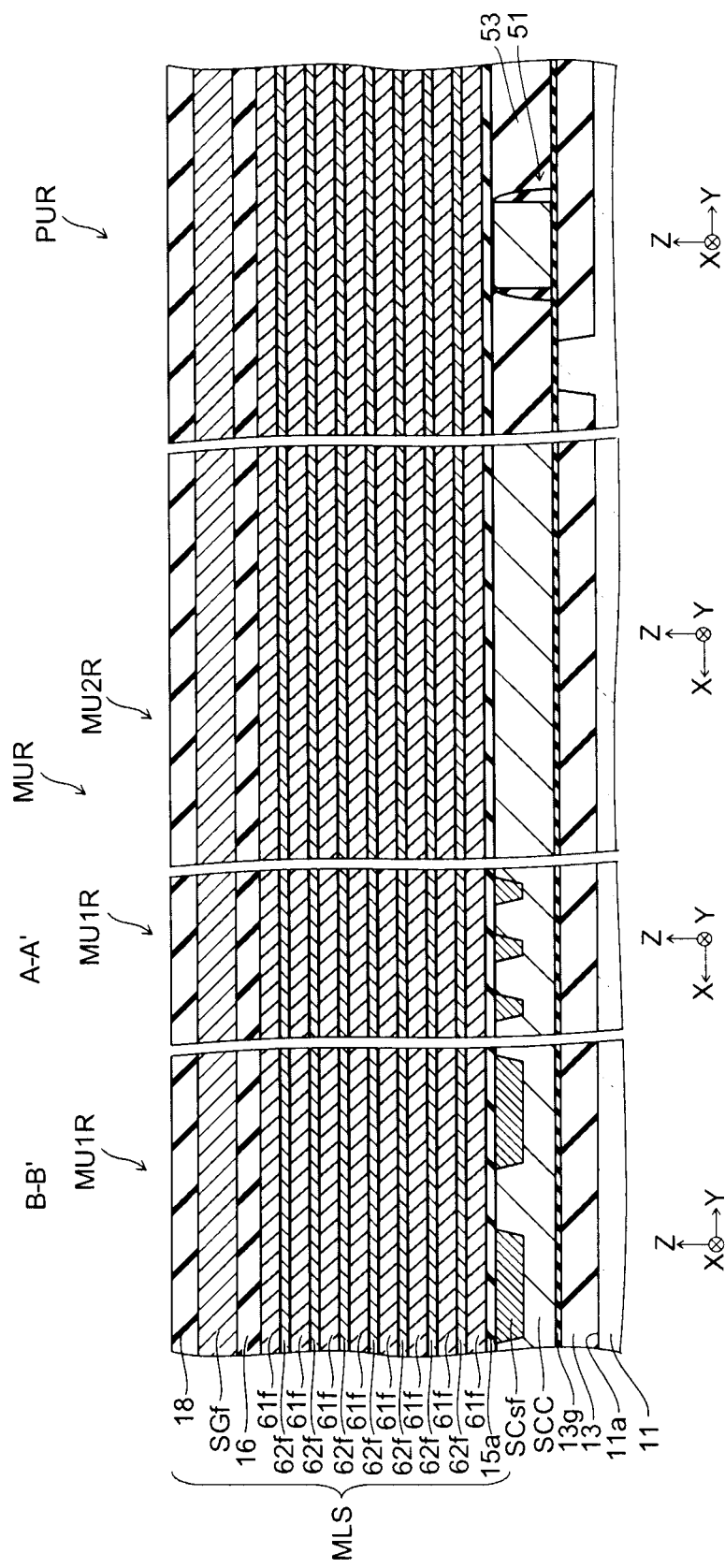
FIG. 6 is a schematic cross-sectional views illustrating the method for manufacturing the nonvolatile semiconductor memory device.

First, as illustrated in FIG. 6, the peripheral circuit unit PCU that includes the peripheral circuit transistor 51 is formed on the major surface 11a of the substrate 11 such as a silicon substrate and the like. For example, the inter-layer insulating film 13 used to form the STI is formed in the major surface 11a of the substrate 11 to form a semiconductor layer that is divided on the major surface 11a side of the substrate 11. The insulating film 13g is formed on the surface of the semiconductor layer; and a conductive film is formed on the insulating film 13g. This conductive film is used to form the peripheral circuit gate electrode 52 and the connection portion conductive layer SCC. This conductive film may include, for example, polysilicon.

In the non-memory region PUR, the peripheral circuit gate electrode 52 is formed by patterning this conductive film into a prescribed configuration. A diffusion region is formed by doping an impurity into the semiconductor layer via the peripheral circuit gate electrode 52. Thereby, the peripheral circuit transistor 51 is formed. Then, an inter-layer insulating film 53 is formed to cover the peripheral circuit transistor 51.

On the other hand, in the matrix memory cell region MU1R, the connection portion conductive layer SCC is formed of the conductive film recited above. Trenches are made in the region of the connection portion conductive layer SCC where the semiconductor connection portions SC are formed. The Z-axis direction depth of the trenches is, for example, 100 nanometers (nm). After making the trenches, a buried sacrificial film SCsf is formed in the interior of the trenches and on the connection portion conductive layer SCC. The buried sacrificial film SCsf includes, for example, silicon nitride. Subsequently, the surface of the buried sacrificial film SCsf is etched by, for example, RIE (Reactive Ion Etching). At this time, the time of the etching is adjusted such that the buried sacrificial film SCsf remains in the interior of the trenches.

Then, the insulating film 15a is formed on the connection portion conductive layer SCC, the sacrificial film SCsf, the peripheral circuit transistor 51, and the inter-layer insulating film 53. The insulating film 15a may include, for example, silicon oxide.

Continuing, a stacked film used to form the main body of the stacked body ML is formed by, for example, repeatedly depositing a doped polysilicon film 61f (a conductive material film) to which an impurity is added on the inter-layer insulating film 53 alternately with a non-doped polysilicon film 62f to which an impurity is not added. The impurity of the doped polysilicon films 61f may include, for example, phosphorus (P). The impurity concentration is, for example, $3 \times 10^{20}$ atoms/cm$^3$. The doped polysilicon films 61f and the non-doped polysilicon films 62f are formed by, for example, CVD (Chemical Vapor Deposition).

The stacked film of the doped polysilicon films 61f and the non-doped polysilicon films 62f also is formed in the non-memory region PUR. The stacked film formed in the non-memory region PUR is used to form the main body of the dummy conductive films 65.

Then, the inter-layer insulating film 16 is formed on this stacked film; a selection gate electrode film SGf used to form the selection gate electrodes SG is formed on the inter-layer insulating film 16; and the inter-layer insulating film 18 is formed on the selection gate electrode film SGf. The selection gate electrode film SGf may include, for example, polysilicon to which an impurity is added.

The selection gate electrode film SGf also is formed in the non-memory region PUR. The selection gate electrode film SGf formed in the non-memory region PUR is used to form the main body of the resistance element unit 80.

In the embodiment, the stacked film including the doped polysilicon films 61$f$ and the non-doped polysilicon films 62$f$, the inter-layer insulating film 16, the selection gate electrode film SGf, and the inter-layer insulating film 18 are called a conductive film stacked body MLS.

Figure 7:
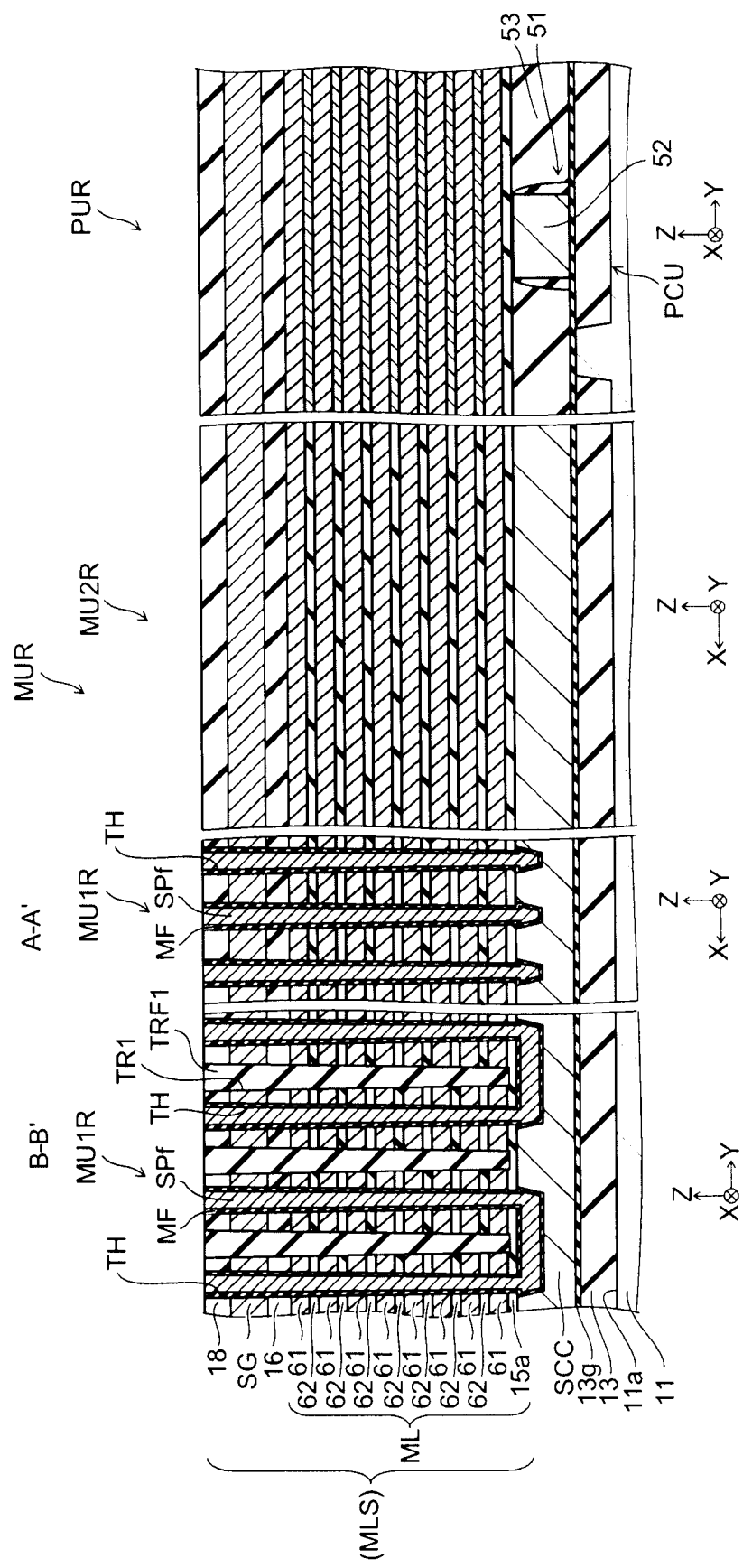
FIG. 7 is a schematic cross-sectional views illustrating the method for manufacturing the nonvolatile semiconductor memory device.

Then, as illustrated in FIG. 7, trenches TR1 are made in the conductive film stacked body MLS by lithography and RIE; and an insulating film TR1$f$ is filled into the trenches TR1. The insulating film TR1$f$ may include, for example, silicon nitride or silicon oxide. The insulating film TR1$f$ is used to form the inter-layer insulating films ILP that divide the electrode films 61 from each other.

Continuing, the through-holes TH are made in the conductive film stacked body MLS by lithography and RIE. The side surfaces of the doped polysilicon films 61$f$ are exposed at the inner walls of the through-holes TH by making the through-holes TH. Subsequently, the buried sacrificial film SCsf is removed via the through-holes TH using, for example, a hot phosphoric acid solution (e.g., 150° C.). Thereby, the lower portions of two through-holes TH are linked.

Then, the non-doped polysilicon films 62$f$ of the memory region MUR are removed. This may be performed using, for example, an alkaline chemical liquid. The stacked multiple doped polysilicon films 61$f$ are supported by the insulating film TR1$f$ (the inter-layer insulating films ILP).

At this time, in the non-memory region PUR, the non-doped polysilicon films 62$f$ are not removed and remain as-is. In the non-memory region PUR, the doped polysilicon films 61$f$ are first dummy films 61$d$ of the dummy conductive films 65; and in the non-memory region PUR, the non-doped polysilicon films 62$f$ are second dummy films 62$d$ of the dummy conductive films 65. In other words, the dummy conductive films 65 are formed.

In this specific example, the impurity included in the doped polysilicon films 61$f$ diffuses into the non-doped polysilicon films 62$f$ by heat treatment and the like of the processes; and the doped polysilicon films 61$f$ (the first dummy films 61$d$) and the non-doped polysilicon films 62$f$ (the second dummy films 62$d$) become, for example, integrated. In other words, in this specific example, the dummy conductive films 65 become integrated conductive films; and there are cases where the boundaries between the first dummy films 61$d$ and the second dummy films 62$d$ become indistinct.

Continuing, for example, silicon oxide films are formed between the multiple doped polysilicon films 61$f$ by, for example, CVD. These silicon oxide films are used to form the inter-electrode insulating films 62; and the doped polysilicon films 61$f$ are used to form the electrode films 61. Thereby, the stacked body ML is formed.

Subsequently, the silicon oxide film deposited on the side surfaces inside the through-holes TH is removed by, for example, dilute hydrofluoric acid treatment.

Then, the memory film MF is formed continuing from the dilute hydrofluoric acid treatment recited above. The memory film MF is a film having a so-called ONO structure in which the storage layer 48 of, for example, silicon nitride is provided between the outer insulating film 43 and the inner insulating film 42 of, for example, silicon oxide (referring to FIG. 4). Then, a semiconductor pillar film SPf used to form the semiconductor pillars SP is formed continuing from the formation of the memory film MF. For example, a polysilicon film is formed as the semiconductor pillar film SPf.

Figure 8:
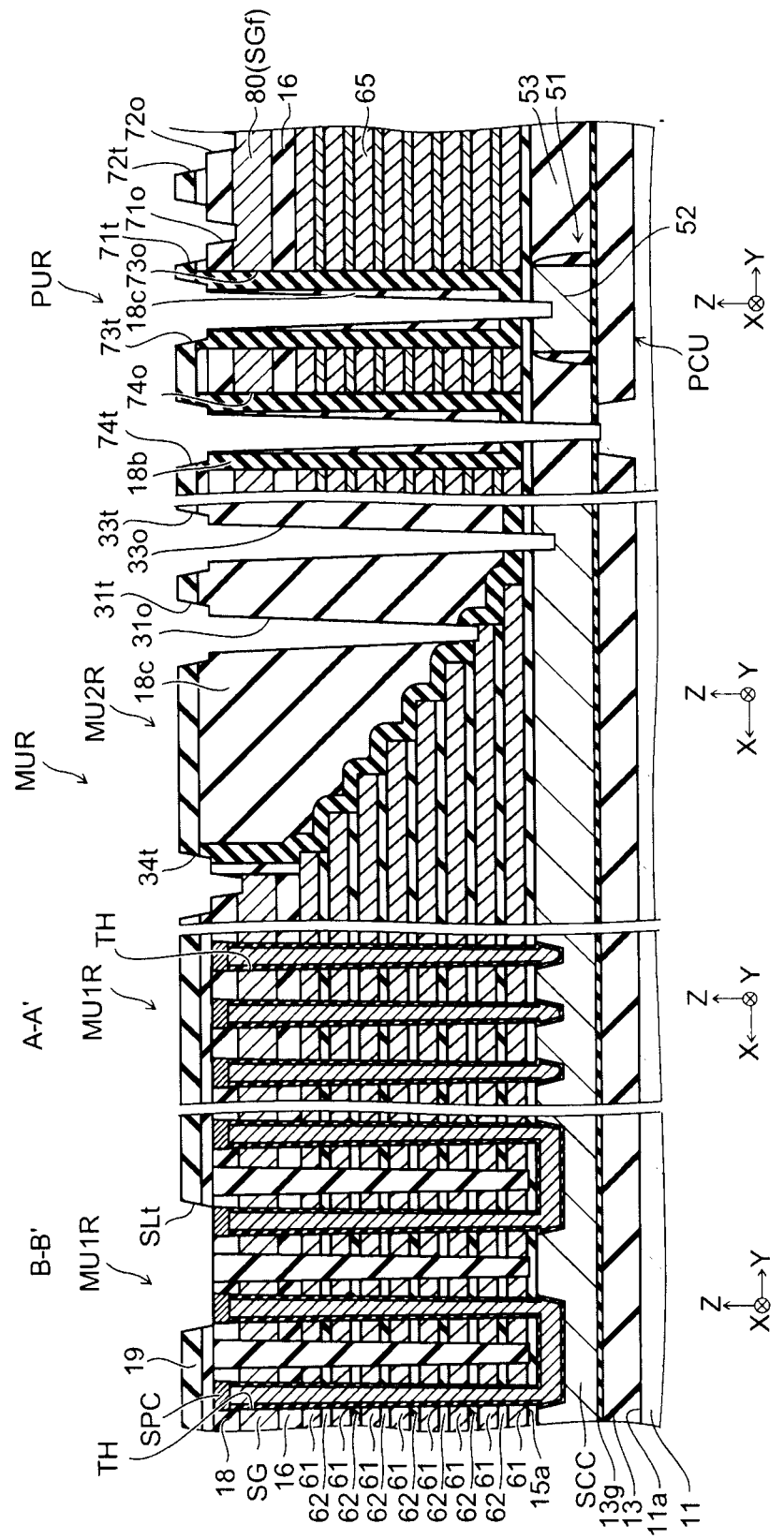
FIG. 8 is a schematic cross-sectional views illustrating the method for manufacturing the nonvolatile semiconductor memory device.

Continuing as illustrated in FIG. 8, a portion of the semiconductor pillar film SPf filled into the through-holes TH is caused to recede by, for example, RIE; and subsequently, a polysilicon film (e.g., a polysilicon film to which an impurity is added) used to form semiconductor pillar contact portions SPC is filled into the space of the upper portions of the through-holes TH and planarized. Thereby, memory strings having U-shaped configurations are formed.

Then, in the interconnect connection region MU2R, the end portions of the electrode films 61 are patterned into a stairstep configuration by repeatedly performing slimming a resist film and RIE. After this patterning, the end portions of the electrode films 61 that are patterned into the stairstep configuration are exposed in the interconnect connection region MU2R.

Continuing, the insulating film TR1$f$ filled into the trenches TR1 is removed using, for example, a hot phosphoric acid solution (e.g., 150° C.). Thereby, the end portions of the selection gate electrodes SG and the end portions of the electrode films 61 are exposed at the inner walls of the trenches TR1. Subsequently, a metal (cobalt, nickel, etc.) is deposited in the interior of the trenches TR1 and in the interconnect connection region MU2R; and heat treatment is performed. Thereby, silicides are formed in the end portions of the selection gate electrodes SG and the end portions of the electrode films 61 exposed in the interconnect connection region MU2R and in the end portions of the electrode films 61 exposed at the inner walls of the trenches TR1. After forming the silicides, the metal remaining on the end portions of the inter-layer insulating films 62 is removed. Then, an opening 73$o$ is made in the portion of the stacked film (an inter-layer insulating film 18$a$, the inter-layer insulating film 18, a dummy selection gate electrode SGd, the inter-layer insulating film 16, and the dummy conductive films 65) where the contact electrode 73$p$ is formed; and an opening 74$o$ is made in the portion of the stacked film (the inter-layer insulating film 18$a$, the inter-layer insulating film 18, the dummy selection gate electrode SGd, the inter-layer insulating film 16, and the dummy conductive films 65) where the contact electrode 74$p$ is formed. By making the opening 73$o$, the selection gate electrode film SGf is subdivided; and the selection gate electrode film SGf on the non-memory region PUR side becomes the resistance element unit 80.

Although the silicide is included in the selection gate electrode SG in the process described above, the silicide is not included in the resistance element unit 80. Thereby, the resistance value of the resistance element unit 80 is higher than the resistance value of the selection gate electrode SG even in the case where the selection gate electrode SG and the resistance element unit 80 are formed from the same selection gate electrode film SGf. It is unnecessary to increase the surface area of the resistance element unit 80 as viewed from the Z-axis direction because the silicide is not formed in the resistance element unit 80.

Then, a silicon oxide film used to form the inter-layer insulating film 19 is formed by, for example, plasma CVD; and subsequently, in the interconnect connection region MU2R, contact holes 310 for the contact electrodes 31 connected to the electrode films 61 and a contact hole 33$o$ for the contact electrode 33 connected to the connection portion conductive layer SCC are made. In the non-memory region PUR, an opening 710 for the contact electrode 71$p$ connected to the resistance element unit 80 and an opening 72$o$ for the contact electrode 72$p$ connected to the resistance element unit 80 are made.

Continuing, a trench SLt is made in the portion of the inter-layer insulating film 19 and the inter-layer insulating film 18a where the source line SL is formed. Then, a trench 34t is made in the portion of the inter-layer insulating film 19 and the inter-layer insulating film 18a where the contact interconnect 34 that is connected to the selection gate electrode SG is formed. Continuing, trenches 31t, 33t, 71t, 72t, 73t, and 74t are made respectively in the portions of the inter-layer insulating film 19 and the inter-layer insulating film 18a where the connection portions of the contact electrodes 31, 33, 71p, 72p, 73p, and 74p are formed.

Figure 9:
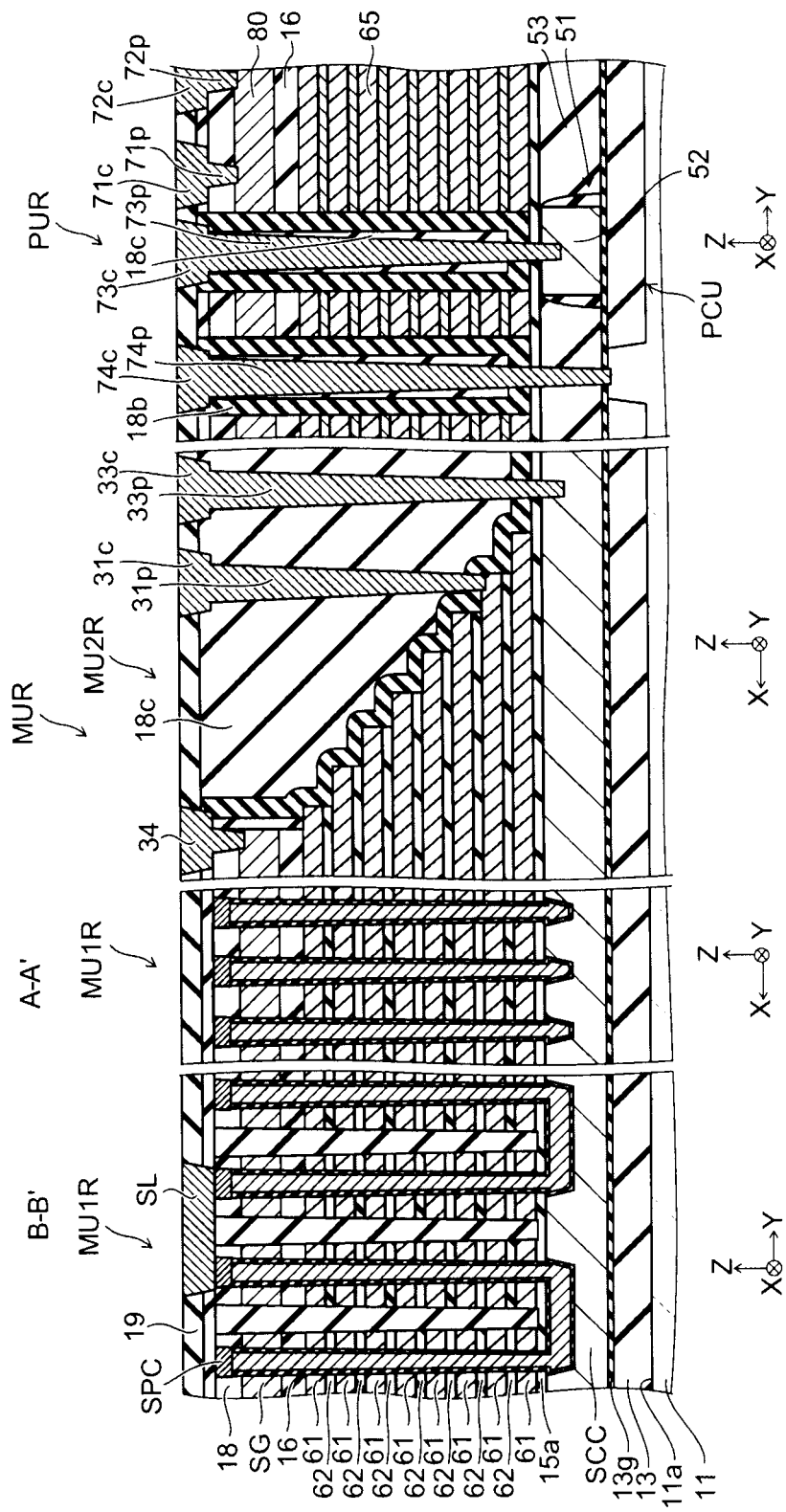
FIG. 9 is a schematic cross-sectional views illustrating the method for manufacturing the nonvolatile semiconductor memory device.

Then, as illustrated in FIG. 9, a conductive film is filled into the remaining space of the trenches SLt, 34t, 31t, 33t, 71t, 72t, 73t, and 74t, the contact holes 31o and 33o, the openings 71o, 72o, and 73o, and the opening 74o. This conductive film may include, for example, a stacked film of a Ti film/TiN film/W film. Then, the upper surface of the conductive film is removed using CMP (Chemical Mechanical Polishing). Thus, the contact plugs and the interconnects are formed simultaneously by a dual damascene process.

Continuing, on the conductive film, the formation of the bit line BL and the interconnects of the same layer as the bit line BL (the word interconnect 32 and the interconnects 35, 71, 72, 73, and 74), the formation of the inter-layer insulating film 25, the formation of the metal interconnects 28a, 28b, 28c, and 28d, the formation of the inter-layer insulating film 27, and the formation of the passivation film 29 (e.g., the silicon nitride film) are performed (referring to FIG. 2). Thereby, the nonvolatile semiconductor memory device 110 is completed.

Thus, the manufacturing method according to this embodiment relates to the method for manufacturing the nonvolatile semiconductor memory device 110 recited above. This manufacturing method may include the following processes.

Figure 11:
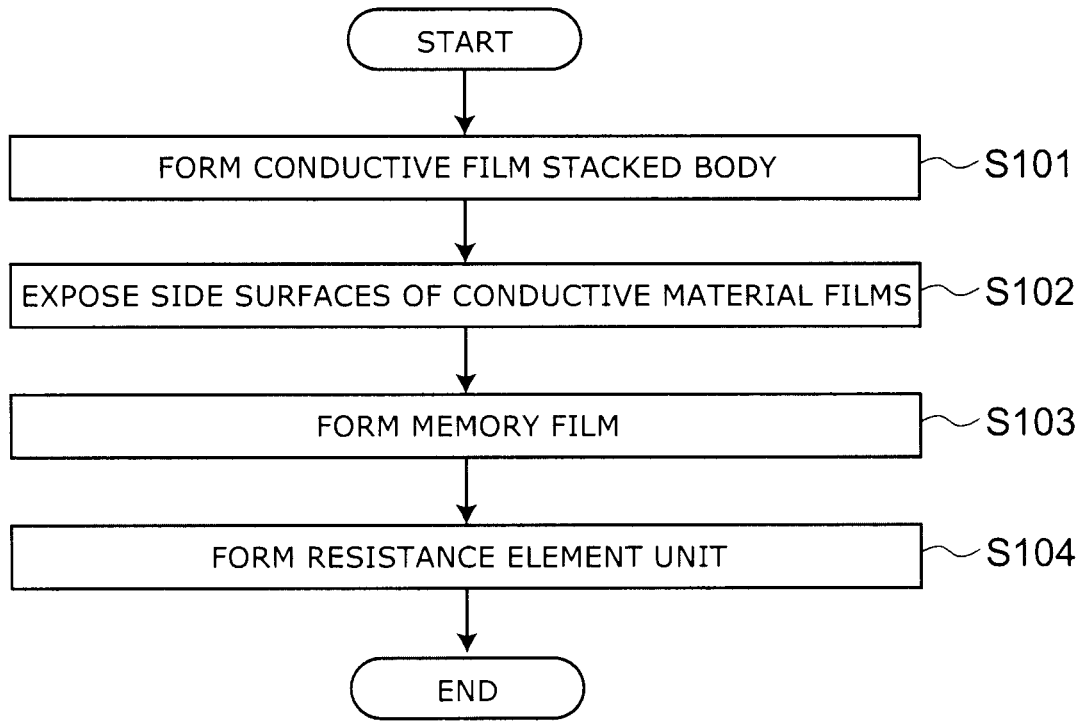
FIG. 11 is a flowchart illustrating processes of the method for manufacturing the nonvolatile semiconductor memory device.

FIG. 11 is a flowchart illustrating processes of the method for manufacturing the nonvolatile semiconductor memory device.

Namely, as illustrated in FIG. 11, this manufacturing method may include a process of forming a conductive film stacked body that includes multiple conductive material films stacked along the first axis on the major surface and an inter-layer insulating film provided between two of the conductive material films mutually adjacent along the first axis (a first step (step S101)), a process of exposing the side surfaces of the multiple conductive material films in a first region of the conductive film stacked body used to form the memory unit (a second step (step S102)), a process of forming the first semiconductor layer in the first region to oppose the side surfaces of the multiple conductive material films and forming a memory film provided between the first semiconductor layer and the side surfaces (a third step (step S103)), and a process of forming the resistance element unit in a portion of the conductive material film of the uppermost layer of the multiple conductive material films in a second region of the conductive film stacked body used to form the non-memory unit (a fourth step (step S104)).

The process of forming the resistance element unit (the fourth step (step S104)) may include a process of forming the conductive material film of the uppermost layer of the multiple conductive material films included in the first region to be a selection gate electrode configured to control a conduction of the semiconductor layer.

In this manufacturing method, polycrystalline silicon may be used as the conductive material film. The process of forming the resistance element unit (the fourth step (step S104)) may include a process of causing the impurity concentration of a portion of the conductive material film included in the second region to be lower than the impurity concentration of a portion of the conductive material films included in the first region.

The process of forming the first memory film (the third step (step S103)) may include a process of forming a silicide in a portion of the conductive material films included in the first region.

Although the resistance value of the resistance element unit 80 is higher than the resistance value of the selection gate electrode SG by the absence of the silicide in the manufacturing method described above, the amount of the silicide contained in the resistance element unit 80 may be lower than the amount of the silicide contained in the selection gate electrode SG.

The resistance value of the resistance element unit may be set by adjusting the impurity concentration of the resistance element unit after forming the resistance element unit 80 by subdividing the selection gate electrode film SGf by making the opening 73o. For example, the resistance value of the resistance element unit 80 can be higher than the resistance value of the selection gate electrode SG and the resistance element unit 80 can function as a resistance element by adjusting the impurity concentration of the resistance element unit 80 to be lower than the impurity concentration of the selection gate electrode SG.

In such a method for manufacturing the nonvolatile semiconductor memory device 110, the resistance element unit 80 can be formed in a layer higher than the stacked body ML by utilizing the selection gate electrode film SGf used to form the selection gate electrode SG. In other words, the resistance element unit 80 is formed in the same manufacturing process as the selection gate electrode SG. When forming the contact electrodes 71p and 72p connected to the resistance element unit 80, the layout of the contact electrodes 71p and 72p can be easy because it is sufficient to make shallow openings 71o and 72o. Also, the contact electrodes 71p and 72o can be finer.

Thus, it is possible to increase the design freedom of the interconnects including the contact electrodes 71p and 72p, make the non-memory unit PU smaller, and downsize the entire nonvolatile semiconductor memory device 110.

Second Embodiment

Figure 10:
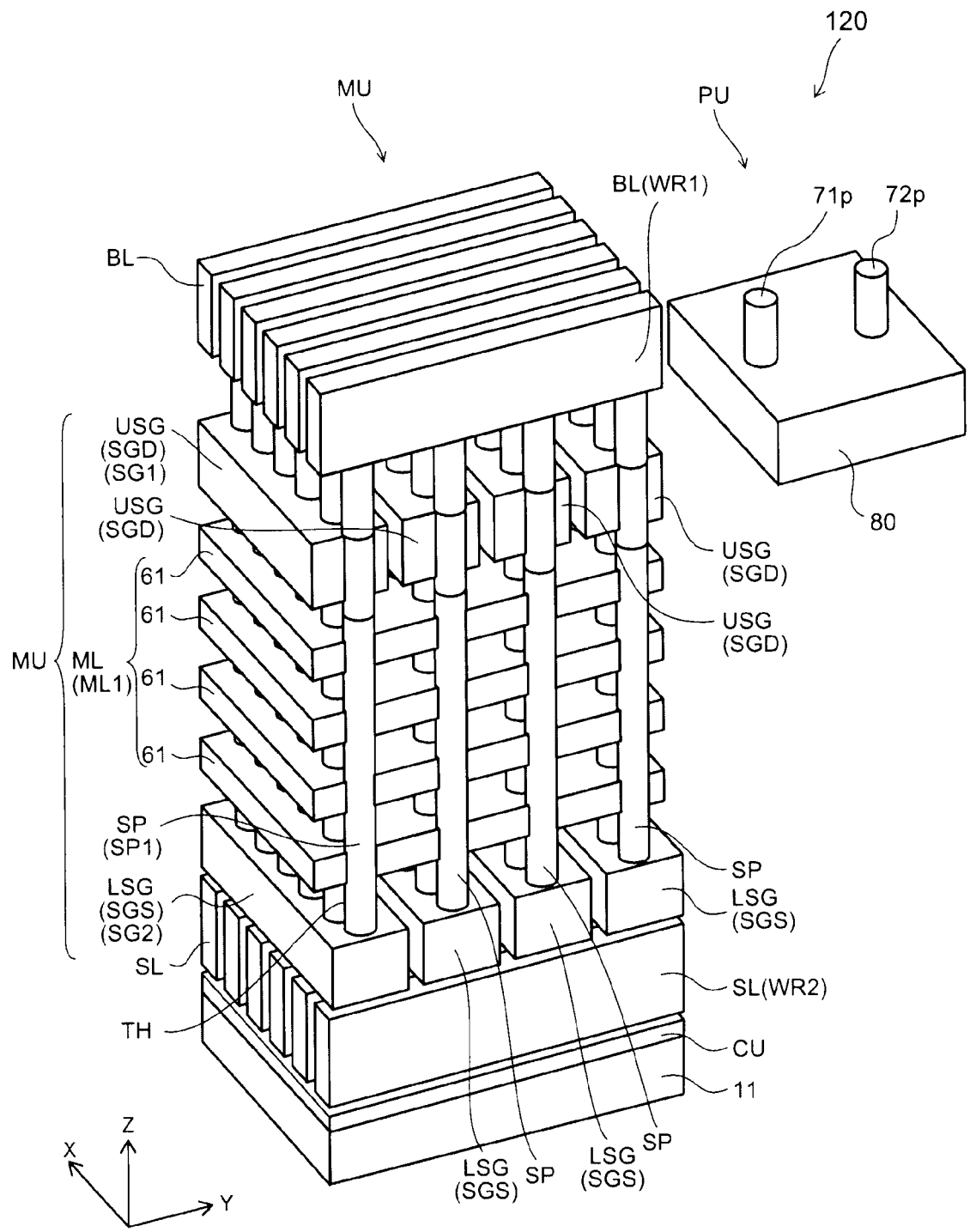
FIG. 10 is a schematic perspective view illustrating the configuration of a nonvolatile semiconductor memory device according to a second embodiment.

FIG. 10 is a schematic perspective view illustrating the configuration of a nonvolatile semiconductor memory device according to a second embodiment.

For easier viewing in FIG. 10, only the conductive portions are illustrated, and the insulating portions are not illustrated.

Namely, in FIG. 10, the memory unit MU and the non-memory unit PU of the nonvolatile semiconductor memory device 120 according to this embodiment are illustrated.

The configurations of the non-memory unit PU and the interconnect connection unit MU2 of the memory unit MU of the nonvolatile semiconductor memory device 120 are similar to those of the nonvolatile semiconductor memory device 110, and a description is therefore omitted.

In the nonvolatile semiconductor memory device 120 according to this embodiment as illustrated in FIG. 10, the semiconductor connection portion SC is not provided; and each of the semiconductor pillars SP is independent. In other words, in the nonvolatile semiconductor memory device 120, a NAND string having a straight line configuration is provided.

In the memory unit MU of the nonvolatile semiconductor memory device 120, an upper selection gate electrode USG (i.e., the first selection gate electrode SG1, e.g., a drain-side selection gate electrode SGD) is provided on the stacked body ML; and a lower selection gate electrode LSG (i.e., the second selection gate electrode SG2, e.g., a source-side selection gate electrode SGS) is provided under the stacked body ML. The upper selection gate electrode USG is an example of a conductive film.

The resistance element unit 80 is provided in the non-memory unit PU of the nonvolatile semiconductor memory device 120. The resistance element unit 80 is provided in the same layer as the upper selection gate electrode USG.

Even in the case of the nonvolatile semiconductor memory device 120 in which such a NAND string having a straight line configuration is provided, the manufacturing of the contact electrodes 71$p$ and 72$p$ that connect to the resistance element unit 80 is easier by providing the resistance element unit 80 in the same layer as the upper selection gate electrode USG. Also, the design freedom of the disposition and the interconnect layout of the contact electrodes 71$p$ and 72$p$ that connect to the resistance element unit 80 increases. Thereby, the non-memory unit PU can be smaller.

According to the embodiment, a nonvolatile semiconductor memory device and a method for manufacturing for which downsizing is possible are provided.

Hereinabove, exemplary embodiments of the invention are described with reference to specific examples. However, the invention is not limited to these specific examples. For example, one skilled in the art may similarly practice the invention by appropriately selecting specific configurations of components included in nonvolatile semiconductor memory devices such as electrode films, inter-electrode insulating films, selection gate electrodes, semiconductor pillars, semiconductor connection portions, connection portion conductive films, storage layers, inner insulating films, outer insulating films, insulating films, conductive films, interlayer insulating films, source lines, bit lines, interconnects, dummy conductive films, dummy electrodes, contact electrodes, and the like from known art; and such practice is included in the scope of the invention to the extent that similar effects are obtained.

Further, any two or more components of the specific examples may be combined within the extent of technical feasibility and are included in the scope of the invention to the extent that the spirit of the invention is included.

Moreover, all nonvolatile semiconductor memory devices practicable by an appropriate design modification by one skilled in the art based on the nonvolatile semiconductor memory devices described above as embodiments of the invention also are within the scope of the invention to the extent that the spirit of the invention is included.

Furthermore, various modifications and alterations within the spirit of the invention will be readily apparent to those skilled in the art. All such modifications and alterations should therefore be seen as within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A nonvolatile semiconductor memory device, comprising:
    a substrate;
    a memory unit provided on the substrate; and
    a non-memory unit provided on the substrate to be juxtaposed with the memory unit in a plane parallel to a major surface of the substrate,
    the memory unit including:
        a first stacked body including a plurality of first electrode films and a first inter-electrode insulating film, the plurality of first electrode films being stacked along a first axis perpendicular to the major surface, the first inter-electrode insulating film being provided between two of the first electrode films mutually adjacent along the first axis;
        a first semiconductor layer opposing side surfaces of the plurality of first electrode films, the first semiconductor layer piercing the stacked body along the first axis;
        a first memory film provided between the first semiconductor layer and the plurality of first electrode films, the first memory film provided along the first axis around the first semiconductor layer; and
        a first conductive film provided on the first stacked body apart from the first stacked body, and
    the non-memory unit including a resistance element unit of the same layer as the first conductive film.

2. The device according to claim 1, wherein the first conductive film is a selection gate electrode configured to control a conduction of the first semiconductor layer.

3. The device according to claim 1, wherein:
    the first conductive film and the resistance element unit include polycrystalline silicon; and
    an impurity concentration of the resistance element unit is lower than an impurity concentration of the first conductive film.

4. The device according to claim 1, wherein:
    the first conductive film includes a silicide; and
    an amount of the silicide contained in the resistance element unit is lower than an amount of the silicide contained in the first conductive film, or the resistance element unit does not include the silicide.

5. The device according to claim 1, wherein the non-memory unit includes a contact electrode provided on the resistance element unit to conduct to the resistance element unit.

6. The device according to claim 1, wherein the first memory film includes a stacked film, the stacked film including a first insulating layer including an oxide, a second insulating layer including a nitride, and a third insulating layer including an oxide stacked in this order from the first electrode films toward the first semiconductor layer.

7. The device according to claim 1, wherein the memory unit includes a plurality of the first semiconductor layers.

8. The device according to claim 1, wherein the memory unit further includes:
    a second stacked body adjacent to the first stacked body in a second axis perpendicular to the first axis, the second stacked body including a plurality of second electrode films stacked in the first axis and a second inter-electrode insulating film provided between two of the second electrode films mutually adjacent along the first axis;
    a second conductive film provided on the second stacked body apart from the second stacked body;
    a second semiconductor layer piercing the second stacked body along the first axis;
    a second memory film provided between the second semiconductor layer and the plurality of second electrode films; and a semiconductor connection portion connecting one end of the first semiconductor layer to one end of the second semiconductor layer.

9. The device according to claim 1, wherein a thickness of the first conductive film along the first axis is equal to a thickness of the resistance element unit along the first axis.

10. The device according to claim 1, wherein the memory unit further includes an interconnect connection unit juxtaposed with the memory unit in a plane parallel to the major surface.

11. The device according to claim 1, wherein:
the memory unit includes an interconnect connection unit; and
the interconnect connection unit includes draw-out interconnects formed by extending the plurality of first electrode films in a second axis orthogonal to the first axis.

12. The device according to claim 11, wherein lengths of the draw-out interconnects along the second axis differ along the first axis between layers of the draw-out interconnects.

13. A method for manufacturing a nonvolatile semiconductor memory device, the device including a substrate, a memory unit provided on a major surface of the substrate, and a non-memory unit juxtaposed with the memory unit in a plane parallel to the major surface, the memory unit including a first stacked body, a first semiconductor layer, a first memory film, and a first conductive film, the first stacked body including a plurality of first electrode films and a first inter-electrode insulating film, the plurality of first electrode films being stacked along a first axis perpendicular to the major surface, the first inter-electrode insulating film being provided between two of the first electrode films mutually adjacent along the first axis, the first semiconductor layer being provided to oppose side surfaces of the plurality of first electrode films, the first memory film being provided between the first semiconductor layer and the plurality of first electrode films, the first conductive film being provided on the first stacked body apart from the first stacked body, the non-memory unit including a resistance element unit of the same layer as the first conductive film, the method comprising:
forming a conductive film stacked body on the major surface, the conductive film stacked body including a plurality of conductive material films stacked along the first axis and an inter-layer insulating film provided between two of the conductive material films mutually adjacent along the first axis;
forming a through-hole piercing the stacked body along the first axis in a first region of the conductive film stacked body used to form the memory unit;
forming the first semiconductor layer extending in the through-hole along the first axis in the first region and forming the first memory film in the first region between the first semiconductor layer extending in the through-hole along the first axis and side surfaces of the plurality of conductive material films; and
forming the resistance element unit in a second region of the conductive film stacked body used to form the non-memory unit in a portion of the conductive material film of the uppermost layer of the plurality of conductive material films.

14. The method according to claim 13, wherein the forming of the resistance element unit includes forming the conductive material film of the uppermost layer of the plurality of conductive material films of the first region to be a selection gate electrode configured to control a conduction of the first semiconductor layer.

15. The method according to claim 13, wherein:
polycrystalline silicon is used as the conductive material film; and
the forming of the resistance element unit includes causing an impurity concentration of a portion of the conductive material film included in the second region to be lower than an impurity concentration of a portion of the conductive material films included in the first region.

16. The method according to claim 13, wherein the forming of the first memory film includes forming a silicide in a portion of the conductive material films included in the first region.

17. A nonvolatile semiconductor memory device, comprising:
a substrate;
a memory unit provided on the substrate; and
a non-memory unit provided on the substrate to be juxtaposed with the memory unit in a plane parallel to a major surface of the substrate,
the memory unit including:
a first stacked body including a plurality of first electrode films and a first inter-electrode insulating film, the plurality of first electrode films being stacked along a first axis perpendicular to the major surface, the first inter-electrode insulating film being provided between two of the first electrode films mutually adjacent along the first axis;
a first semiconductor layer opposing side surfaces of the plurality of first electrode films;
a first memory film provided between the first semiconductor layer and the plurality of first electrode films;
a first conductive film provided on the first stacked body apart from the first stacked body;
a second stacked body adjacent to the first stacked body in a second axis perpendicular to the first axis, the second stacked body including a plurality of second electrode films stacked in the first axis and a second inter-electrode insulating film provided between two of the second electrode films mutually adjacent along the first axis;
a second conductive film provided on the second stacked body apart from the second stacked body;
a second semiconductor layer piercing the second stacked body along the first axis;
a second memory film provided between the second semiconductor layer and the plurality of second electrode films; and
a semiconductor connection portion connecting one end of the first semiconductor layer to one end of the second semiconductor layer, and
the non-memory unit including a resistance element unit of the same layer as the first conductive film.

* * * * *